US006734748B2

(12) United States Patent
Livezey

(10) Patent No.: US 6,734,748 B2
(45) Date of Patent: May 11, 2004

(54) PHASE-LOCKED LOOP OSCILLATOR WITH COUNTER BYPASS

(75) Inventor: Darrell Livezey, Auburn, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/207,575

(22) Filed: Jul. 29, 2002

(65) Prior Publication Data
US 2004/0017263 A1 Jan. 29, 2004

(51) Int. Cl.[7] .................................. H03L 1/00
(52) U.S. Cl. ........................ 331/158; 327/160
(58) Field of Search .................. 331/158, 1 R, 331/11, 25, 1 A; 327/156, 159, 160; 375/374, 375, 376

(56) References Cited

U.S. PATENT DOCUMENTS

| 4,929,918 A | | 5/1990 | Chung et al. ............. 331/10 |
|---|---|---|---|
| 5,015,970 A | * | 5/1991 | Williams et al. ........... 331/11 |
| 5,406,592 A | | 4/1995 | Baumert ................ 327/159 |
| 5,552,750 A | | 9/1996 | Barrett, Jr. et al. ........ 331/25 |
| 6,392,494 B2 | * | 5/2002 | Takeyabu et al. .......... 331/11 |
| 2003/0038681 A1 | * | 2/2003 | Djafari et al. ............ 331/1 A |

* cited by examiner

Primary Examiner—Linh M. Nguyen
(74) Attorney, Agent, or Firm—Blakely, Sokoloff, Taylor & Zafman, LLP

(57) ABSTRACT

A phase-locked loop circuit includes one loop for regulating phase of a VCO with respect to a reference source. In another loop, VCO frequency is compared to frequency of a crystal oscilator. Digital counters divide the frequency of the crystal oscillator and VCO to a common reference frequency. Once the frequency loop is locked, the counter at the output of the crystal oscillator is bypassed. The counter is bypassed by a flip-flop circuit clocked by the crystal oscillator and receiving a scaled input from the VCO. While the VCO frequency error is in the frequency range of correction capability of the Phase-locked loop, the output of the flip-flop will duplicate the output of the counter. Thus, the counter can be bypassed and shut off.

14 Claims, 2 Drawing Sheets

PHASE-LOCKED LOOP OSCILLATOR WITH COUNTER BYPASS

FIELD OF INVENTION

The present invention relates to frequency sources utilizing a phase-locked loop and more particularly to automatic frequency stabilization providing low-noise and low power consumption.

BACKGROUND OF THE INVENTION

Frequency sources stabilized by a phase-locked loop are used in a wide variety of applications. One of the many applications is in a transceiver in a wireless telephone.

It is desired to increasingly miniaturize circuitry. It is important to provide a design wherein different stages of a stabilized frequency source, for example a local oscillator and digital counters, can be integrated onto one integrated circuit chip. For improved battery life, it is important to provide a circuit which will draw less current in comparison to prior art circuits. In communications as in many other applications, it is also desired to reduce spurious noise.

Analog phase-locked loop circuits utilize a voltage controlled oscillator (VCO) as a clock source. Closed loop phase and frequency control are provided to stabilize the VCO output frequency. The phase-locked loop maintains closed loop control. However, the phase-locked loop has a limited dynamic range. For example, the phase-locked loop may compensate for frequency variations in the source on the order of a few percent. However, if expensive manufacturing techniques are to be avoided in the construction of the VCO, VCOs will have an initial free running frequency that can vary significantly from the desired operating value. For this reason, digital counters are utilized in closed loop frequency control in conjunction with the phase-locked loop. Circuits including the digital counters in a frequency control loop reduce error in the VCO output frequency error to a sufficiently low level that the phase-locked loop is capable of maintaining the correct VCO frequency.

Digital counters have the capacity to produce different forms of spurious noise. The spurious noise can be coupled to the output of the VCO. The problem is magnified since, in recent years, more functions have been integrated into fewer and smaller integrated circuit chips. Having VCO and phase-locked loops on a single integrated circuit chip increases the potential for noise to enter the output. The frequency control loop digital counter draws current as well. It is highly desirable to minimize power requirements for operating the digital counter.

SUMMARY OF THE INVENTION

Briefly stated, in accordance with the present invention, there is provided a phase-locked loop circuit including one loop for regulating phase of a VCO with respect to a reference source. In another loop, VCO frequency is compared to frequency of a crystal oscillator. Digital counters divide the frequency of the crystal oscillator and VCO to a common reference frequency. Once the frequency loop is locked, the counter at the output of the crystal oscillator is bypassed. The counter is bypassed by a flip-flop circuit clocked by the crystal oscillator and receiving a scaled input from the VCO. While the VCO frequency error is in the frequency range of correction capability of the phase-locked loop, the output of the flip-flop will duplicate the output of the counter. Thus, the counter can be bypassed and shut off.

BRIEF DESCRIPTION OF THE DRAWINGS

The invention may be further understood by reference to the following description taken in connection with the following drawings.

Of the drawings.

DETAILED DESCRIPTION OF THE INVENTION

Figure 1:
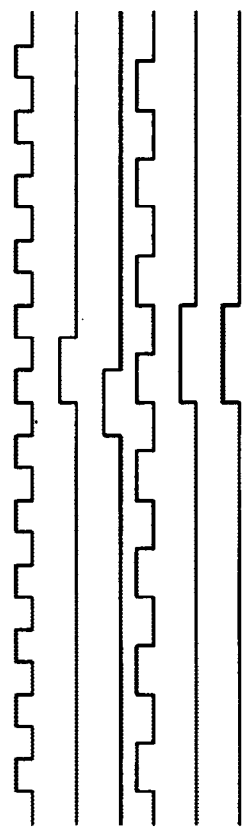
FIG. 1 is a block diagrammatic representation of a preferred form of the present invention.

FIG. 1 is a block diagram of a preferred embodiment of the present invention. A frequency source 1 provides an output frequency at an output terminal 2. The frequency source 1 comprises a phase-locked loop which operates by adjusting the phase and frequency of a voltage controlled oscillator (VCO) 10 in comparison to that of a high accuracy crystal oscillator 14.

The crystal oscillator 14 provides a clock input to a digital counter 20 at a clock terminal 21. The digital counter 20 provides an output at a terminal clock (TC) terminal 22. At the initiation of operation, a two-position switch 26 couples the TC terminal 22 via a switch terminal 25 to an input terminal 32 of a phase and frequency detector 30. The phase and frequency detector 30 can detect a lock of the input at its input terminal 32 with respect to another frequency input. When this occurs, a lock detect signal is provided at a terminal 34 of the phase and frequency detector 30 to an enabling terminal (EN) 24 of the digital counter 20.

The VCO 10 provides an input to a prescaler 40 which provides a clock signal at a clock input terminal 45 of a digital counter 46. For convenience in description, the digital counter 46 is referred to as the VCO digital counter 46. The digital counter 46 provides a frequency output from an output terminal 48 to an input terminal 38 of the phase and frequency detector 30. The digital counter 46 also has a "look-ahead" terminal 47 (discussed below) and an output terminal 49 providing an input to a terminal 42 of the prescaler 40. The input to the terminal 42 controls the modulus of the prescaler 40. One well-known manner of operation selects the modulus in accordance with the count rate at the input terminal 48. The phase and frequency detector 30 has an output terminal 36 which provides an error signal output coupled by a loop filter 52 to the error input terminal 11 of the VCO 10.

Additionally, a bypass path for bypassing the digital counter 20 is provided. The crystal oscillator 14 provides an input to a clock input terminal 56 of a flip-flop 58. A second D input terminal 57 of the flip-flop 58 receives an input from the look-ahead output terminal 47 of the VCO digital counter 46. The flip-flop 58 provides an output at a terminal 60 to a second input terminal 27 of the switch 26.

Figure 2:
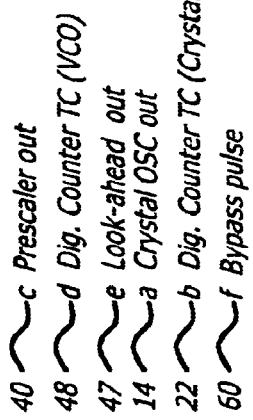
FIG. 2 is a timing diagram useful in understanding the operation of FIG. 1.

Operation of the circuit is explained with respect to FIG. 1 and FIG. 2, which is a timing diagram. FIG. 2 comprises FIGS. 2a through 2f representing outputs of the components by which they are labeled. The output of the crystal oscillator 14 is illustrated in FIG. 2a. This output is represented as a square wave for simplicity in illustration. The square wave is, for purposes of illustration and in terms of circuit operation, is a reasonable approximation of the output of the crystal oscillator 14. After a preselected number of cycles, or counts, applied to the terminal 21 of the digital counter 20, a pulse is provided at the output terminal TC 22 of the digital counter 20. In nominal embodiments, the length of this pulse will approximate once cycle of the crystal oscillator 14. The pulse of FIG. 2b is coupled to the input terminal 32 of the phase and frequency detector 30.

For simplicity of illustration, the high frequency of the VCO 10 is not illustrated. However, FIG. 3c illustrates the output of the prescaler 40, which is the instantaneous frequency of the VCO divided by the modulus selected by the input to the terminal 42. It is noted that closed loop frequency control of the VCO 10 is provided. In practice, the output of the VCO 10 and the frequency output of the prescaler 40 will not be constant. However, the illustration of a constant frequency output of the prescaler 40, particularly on the scale illustrated herein, is a reasonable approximation of the actual waveform. The prescaler 40 provides input clock pulses to the input terminal 45 of the VCO digital counter 46. The output terminal TC 48 provides an input to the phase and frequency detector 30 at the terminal 38. Operation remains in this mode until the VCO frequency is adjusted within a predetermined tolerance of the frequency of the crystal oscilator 14. Frequency error is now within a range that can be regulated by a phase-locked loop. At this time, in response to detecting a frequency lock, the phase and frequency detector 30 changes the level of its output signal at its terminal 34 applied to the switch 26 and to enable terminal 24 of the crystal oscillator digital counter 20. In response to the lock detect signal, the switch 26 changes state to connect the terminal 27 of the switch 26 to the terminal 32 of the phase and frequency detector 30. Consequently, the Q output terminal 60 of the flip-flop 58 is connected to the terminal 32. The input signal of the terminal 24 disables the crystal oscillator digital counter 20.

The digital counter 46 produces a look-ahead output signal at its terminal 47 connected to the D terminal 57 of the flip-flop 58. The look-ahead pulse is selected to come prior to the terminal count pulse of FIG. 2d. Most conveniently, the look-ahead pulse comes one half clock cycle earlier than the standard terminal count pulse. The period of the prescaler 20 must be smaller than twice that of the crystal oscillator 14 for this timing arrangement to work as illustrated. The flip-flop 58 is enabled to produce a pulse Q at its Q output terminal 60 when a crystal oscillator pulse hits the input terminal 56. When the next crystal oscillator 14 output pulse is initiated as seen in FIG. 2a after the initiation of the look-ahead pulse in FIG. 2e, the Q pulse at terminal 60 is triggered as seen in FIG. 2f. This pulse will last for one clock cycle. The process will repeat, and after a prescaled count in received at the input terminal 45 of the VCO digital counter 20, another look-ahead pulse will be provided from the terminal 47 to the D terminal 57. This will enable the flip-flop 60 to provide a bypass pulse when the next crystal oscillator occurs. In this manner, the Q output at the terminal 60, illustrated in FIG. 2f, is made to match the crystal digital counter 20 output at the TC output terminal 24.

Thus the phase and frequency detector 36 continues to receive an input at terminal 32 corresponding to the input that would have been provided at input terminal 34 from the crystal oscillator digital counter 20. Since the digital counter 20 is effectively shut off, the level of spurious noise produced by the frequency source 1 is reduced. Also, supply current consumption is significantly reduced. Consequently, integration of the VCO level and phase-locked loop circuitry on a single integrated circuit chip is greatly facilitated.

Alternatively, a look-ahead pulse from the crystal oscillator 14 may be used to gate the VCO output. However, it is generally preferred to use a dual modulus prescaler between the VCO 11 and the VCO digital counter 46. This still entails the use of a form of VCO counter. Therefore, there is generally more to gain by bypassing the crystal oscillator digital counter 20 is preferred.

Figure 3:
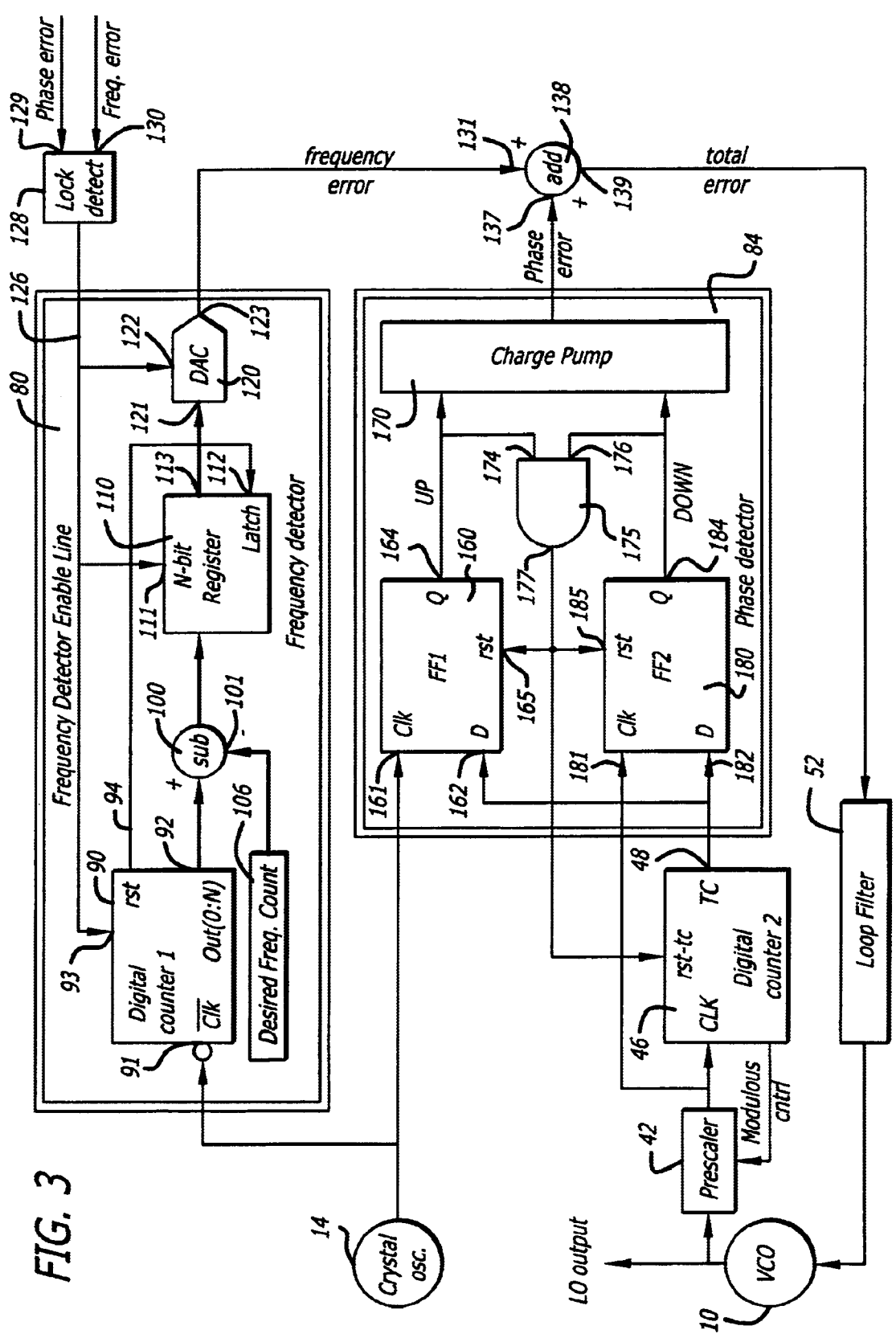
FIG. 3 is a diagram partially in schematic and partially in block diagrammatic form further illustrating an embodiment of the present invention.

FIG. 3 is a partially schematic and partially block diagrammatic view of a specific form of the present invention. In FIG. 3, the same reference numerals are used to denote components which are similar to those in the embodiment of FIG. 1. In the embodiment of FIG. 3, the frequency and phase detector 36 is shown as a separate frequency detector 80 and phase detector 84. In the embodiment of FIG. 3, the frequency detector 20 includes a VCO digital counter 90 having an inverting input terminal 91, an output terminal 92, an enabling terminal 93 and a reset terminal 94. The output terminal 92 provides a count to a summer 100 which receives a subtracting input from a desired frequency counter 106 at a terminal 101. The summer 100 provides an output to an N-bit register 110 having an enabling terminal 111, a latch terminal 112 and an output terminal 113. The output terminal 113 is connected to a digital-to-analog converter (DAC) 120 having an input terminal 121, an enabling terminal 122 and an output terminal 123. The enabling inputs 93, 111 and 122 are connected to an enabling line 126 which supplies a signal from a lock detect circuit 128 having a phase error input terminal 129 and a frequency error input terminal 130. The output of the DAC 120 is supplied to an input terminal 136 of an adder 138. The adder has an input terminal 137 which receives a phase error input from phase detector 84. An output terminal 139 of the summer 138 provides a total error signal to the loop filter 52.

The phase detector 84 comprises a first flip-flop 160 having a clock input terminal 161 receiving an input from the crystal oscillator 14. The flip-flop 160 also receives a D input from the VCO digital counter 46 at an input terminal 162. An output terminal 164 supplies a pulse to a charge pump providing the phase error input to the input terminal 137 of the summer 138. While use of a charge pump provides many operational advantages, many other well-known forms of integration means could be utilized. A Q output terminal 164 of the flip-flop 160 is also connected to the latch input terminal 112 of the N-bit register 110 and the reset terminal 94 of the crystal oscillator digital counter 90. The output terminal 164 is also connected to a first input terminal 174 of an AND gate 175 having a second input terminal 176 and an output terminal 177. The flip-flop 60 also has a reset terminal 165.

The phase detector 84 also includes a second flip-flop 180 having a clock input terminal 181, a D input terminal 182, a Q output terminal 184 and a reset terminal 185. The output of the prescaler 42 is connected to the clock terminal 181 of the second flip-flop 180. The D input terminal 182 receives the output of the VCO digital counter 46. The output terminal 184 of the second flip-flop 180 provides a second input to the charge pump 170 and is also connected to the second input terminal 176 of the AND gate 175. The output terminal 177 is connected to reset terminals 165 and 185 of the flip-flops 160 and 180 respectively. The output terminal 177 is also connected to a reset terminal on the VCO digital counter 46.

In operation, the digital counter 90 serves to measure the error between the frequency of the VCO 10 and the crystal oscillator 14. The digital counter begins starting at zero. The digital counter 90 is incremented on each falling edge of the output of the crystal oscillator 14. When a phase comparison is made as further described below, the output terminal of the flip-flop 160) pulses the input 94 of the digital counter 90. A current count is provided at the output terminal 92, from which a count indicative of the desired frequency is subtracted. The summer 100 provides a different signal to the N-bit register 111. The same pulse that strobes the crystal oscillator digital counter 90 activates the latch input terminal 112 of the N-bit register 111 to store the result. The latched value is proportional to the frequency error of the VCO 10. The DAC 120 converts the digital error signal to an analog signal that is proportional to the frequency error. This analog signal is supplied to the input terminal 136 of the summer 138.

Different forms of digital-to-analog conversion may be provided. For example, the digital-to-analog converter 120 could further comprise well-known digital filtering means. Alternatively, the DAC 120 may be nonlinear. This allows selection of the response that will occur in response to frequency errors. A user may vary the response for such purposed as reducing the lock time or otherwise optimizing responses for different applications. In one application, for example, the DAC 120 may be selected to provide an exponential response. The extra magnitude of the frequency error signal will help reduce lock time, i.e. the time it takes to reach a locked condition, in applications where large frequency changes are expected.

The first and second flip-flops 160 and 180 measure phase error of the VCO 10. When the DC terminal of the digital counter 46 goes high, a "one" level is applied to the D input terminals 182 and 162 of the flip-flops 180 and 160. The flip-flops are enabled to toggle on the next rising edge of the inputs to the respective clock terminals 181 and 161. If the phase of the clock signal of the crystal oscillator 14 is advanced in phase with respect to the output of the prescaler 42, an up signal is generated with a pulse width that is proportional to the phase error. If a rising edge occurs first from the output of the prescaler 42, a down signal is generated with a pulse width proportional to phase error. If both edges occur at the same instant, then the up and down signals will have the same duration. Consequently, there will be a zero phase error signal. The "up" or "down" signals from the output terminals 164 and 184 are supplied to integration means, the charge pump 170 in the present example. The output of the charge pump comprises the phase error, and is supplied to the input terminal 137 of the summer 138.

In order to achieve this operation, the TC output terminal 48 of the VCO digital counter 46 must remain high until both clock edges have been detected. The output signal of the digital counter 46 is latched once it goes high. It stays high until both clock edges have been detected, when both block edges have been detected, outputs from the terminals 164 and 165 become "ONES" at the input terminals 174 and 176 of the AND gate 175. The output at terminal 177 then goes high to reset the flip-flops 160 and 180 and the VCO digital counter 46.

A total error signal is provided at output terminal 139 of the adder 138 is provided which is the sum of the phase error signal and frequency error signal. The total error signal at output terminal 139 is passed through the standard phase-locked loop filter 52, and the filtered error signal controls the VCO 10. As in the embodiment of FIG. 1, when a lock is achieved, the frequency detector 80 can be turned off to save power and reduce spurious noise generations. To this end, the outputs of the DAC 120 and the charge pump 170 are also coupled to input terminals 130 and 129 respectively of the lock detect circuit 128. When the sum of the inputs to the lock detect circuit 128 is within a preselected tolerance level of zero, the lock detect circuit provides disabling signals to the terminals 93, 111 and 122 of the crystal oscillator digital counter 90 and bit register 110 and DAC 120 respectively.

Of course, many specific implementations can be provided to provide a circuit functioning in accordance with the above teachings. For example, the digital frequency error value could be sunned with a digital phase error value in order to obtain a digital total error value. The total error value could be digitally filtered and used to adjust the control voltage of the VCO 10 via a separate DAC. As discussed above, a nonlinear DAC 123 may be used which may also further include digital filtering.

The foregoing teachings will enable those skilled in the art to make departures from the specific examples above to produce a locking counter bypass phase-locked loop frequency source in accordance with the present invention.

What is claimed is:

1. A phase-locked loop frequency source comprising:
   an error detector, a loop filter receiving an output from said error detector, and a voltage controlled oscillator receiving an input from the loop filter and providing an output frequency;
   an oscillator;
   a first counter coupled to be clocked by said oscillator
   a second counter coupled to be clocked by said voltage controlled oscillator;
   said first and second digital counters providing outputs for comparison for said error detector;
   said error detector including a lock detect circuit providing a lock signal when the outputs of said digital counters are locked;
   a clock comparison circuit receiving inputs from said second counter and said oscillator, and when the outputs of said digital counters are locked, said input to the clock comparison circuit from said second counter occurring during a half cycle of said oscillator before said second counter reaches a total count; and
   a switching circuit responsive to the lock signal to couple the output of said first counter to said error detector when the lock signal does not indicate the outputs of said first and second counters are locked, and to couple an output of the clock comparison circuit to said error detector and to disable said first counter when the lock signal indicates the outputs of said first and second counters are locked.

2. The frequency source of claim 1 wherein said oscillator is a crystal oscillator.

3. The frequency source of claim 2 wherein a prescaler is connected between said voltage controlled oscillator and said clock input of said second counter.

4. The frequency source of claim 3 wherein said second counter provides a modulus control signal corresponding to a count level and wherein said prescaler is connected to have a modulus thereof controlled by said modulus control signal.

5. The frequency source according to claim 2 wherein said error detector comprises a frequency detector and a phase detector, providing a frequency error output and a phase error output, respectively, and further comprising summing means for providing an output responsive to the sum of said phase error output and said frequency error output to said loop filter;
   said frequency detector comparing a count of the frequency of said oscillator to a desired count and providing a frequency error count responsive thereto.

6. The frequency source of claim 5 wherein said frequency error count is coupled to a digital to analog converter.

7. The frequency source of claim 6 wherein said digital to analog converter is non-linear.

8. The frequency source of claim 7 wherein said digital to analog converter further comprises a digital filter.

9. The frequency source according to claim 5 wherein said phase detector comprises:

first and second clocking circuits, said first clocking circuit being clocked by the oscillator, said second clocking circuit being clocked by an input to the second counter;

the relative phase of outputs of said first and second clocking circuits representing the phase error after said first and second counters are locked.

10. The frequency source according to claim 9 further comprising a charge pump responsive to the relative phase of outputs of said first and second clocking circuits to provide a phase error signal to said summing means.

11. The frequency source according to claim 10 wherein the outputs from said first and second clocking circuits are combined to provide reset signals to said second counter and said first and second clocking circuits.

12. The frequency source according to claim 11 further comprising a lock detect circuit responsive to the frequency error detector and the phase error detector to disable the frequency detect circuit when said phase and frequency error are within a predetermined tolerance of a zero level.

13. A method for producing a signal with a phase-locked loop voltage controlled oscillator comprising:

driving first and second counters with a reference frequency and a frequency proportional to the voltage controlled oscillator frequency, respectively;

determining a frequency error from the difference in count between an output of the first counter and a desired count;

determining a phase error from the difference in phase between an edge of the reference frequency and an edge of an output of the second counter;

controlling the voltage controlled oscillator responsive to the frequency error and the phase error;

detecting a lock between the reference oscillator and the voltage controlled oscillator; and disabling the first counter while a lock is detected.

14. The method of claim 13 further comprising, in determining the phase error, inputting an output of the second counter to first and second clocking circuits, and clocking said first and second clocking circuits with said reference frequency and said frequency proportional to the voltage controlled oscillator frequency, respectively, the phase error being responsive to the phase between outputs of said first and second clocking circuits.

* * * * *